United States Patent
Lin et al.

(10) Patent No.: US 12,147,889 B2
(45) Date of Patent: Nov. 19, 2024

(54) MIXED-SIGNAL NEURONS FOR NEUROMORPHIC COMPUTING AND METHOD THEREOF

(71) Applicant: Realtek Semiconductor Corp., Hsinchu (TW)

(72) Inventors: Chia-Liang (Leon) Lin, Fremont, CA (US); Shih-Chun Wei, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 1235 days.

(21) Appl. No.: 16/373,745

(22) Filed: Apr. 3, 2019

(65) Prior Publication Data
US 2020/0320373 A1    Oct. 8, 2020

(51) Int. Cl.
G06N 3/063    (2023.01)
G06N 3/04    (2023.01)
G06N 3/06    (2006.01)
H03K 17/16    (2006.01)

(52) U.S. Cl.
CPC .............. *G06N 3/063* (2013.01); *G06N 3/04* (2013.01); *G06N 3/06* (2013.01); *H03K 17/161* (2013.01)

(58) Field of Classification Search
CPC ............ G06N 3/063; G06N 3/04; G06N 3/06; G06N 3/0635; H03K 17/161; G05F 1/56
See application file for complete search history.

(56) References Cited

U.S. PATENT DOCUMENTS

| | | | |
|---|---|---|---|
| 6,411,098 B1* | 6/2002 | Laletin | G01R 19/16542 324/426 |
| 9,209,809 B1* | 12/2015 | Geary | H03K 19/00384 |
| 9,747,546 B2 | 8/2017 | Ross et al. | |
| 10,389,375 B1* | 8/2019 | Fick | G06N 3/065 |
| 10,528,643 B1* | 1/2020 | Choi | G11C 7/1006 |
| 2005/0240647 A1* | 10/2005 | Banihashemi | H03M 13/1105 708/800 |
| 2006/0094361 A1* | 5/2006 | Darabi | H03D 3/008 455/296 |

(Continued)

FOREIGN PATENT DOCUMENTS

| | | |
|---|---|---|
| TW | 201830296 A | 8/2018 |
| TW | 201833824 A | 9/2018 |

OTHER PUBLICATIONS

TW Office Action dated Jun. 3, 2021 in Taiwan application (No. 109109867).

(Continued)

*Primary Examiner* — Li B. Zhen
*Assistant Examiner* — Henry Nguyen
(74) *Attorney, Agent, or Firm* — McClure, Qualey & Rodack, LLP (57) ABSTRACT

An artificial neural network and method are provided. The method includes receiving a set of input voltages; converting a respective input voltage in said set of input voltages into a respective set of local currents using a voltage-to-current conversion; multiplying said respective set of local currents by a respective set of binary signals to establish a respective set of conditionally inverted currents; summing said respective set of conditionally inverted currents into a respective local current; summing all respective local currents into a global current; and converting the global current into an output voltage using a load circuit.

10 Claims, 6 Drawing Sheets

(56) References Cited

U.S. PATENT DOCUMENTS

| | | | |
|---|---|---|---|
| 2013/0144821 A1* | 6/2013 | Heliot | H03M 1/1042 |
| | | | 706/15 |
| 2018/0121796 A1 | 5/2018 | Deisher et al. | |
| 2018/0253643 A1 | 9/2018 | Buchanan et al. | |
| 2018/0285727 A1 | 10/2018 | Baum et al. | |
| 2019/0035449 A1* | 1/2019 | Saida | G06N 3/0635 |
| 2019/0072633 A1* | 3/2019 | Steuer | G01R 31/3191 |
| 2019/0080230 A1* | 3/2019 | Hatcher | G06F 7/5443 |
| 2019/0213234 A1* | 7/2019 | Bayat | G11C 16/0466 |
| 2020/0134419 A1* | 4/2020 | Manipatruni | H01L 43/08 |
| 2020/0167402 A1* | 5/2020 | Newns | G06F 17/10 |

OTHER PUBLICATIONS

Chatterjee et al., "Exploiting Inherent Error-Resiliency of Neuromorphic Computing to Achieve Extreme Energy-Efficiency through Mixed-Signal Neurons," arXiv preprint arXiv:1806.05141, Oct. 22, 2018.

* cited by examiner

MIXED-SIGNAL NEURONS FOR NEUROMORPHIC COMPUTING AND METHOD THEREOF

BACKGROUND OF THE DISCLOSURE

Field of the Invention

The present invention generally relates to neuromorphic computing and more particularly to a mixed-signal neuron architecture that can mitigate an impairment.

Description of Related Art

Figure 1:
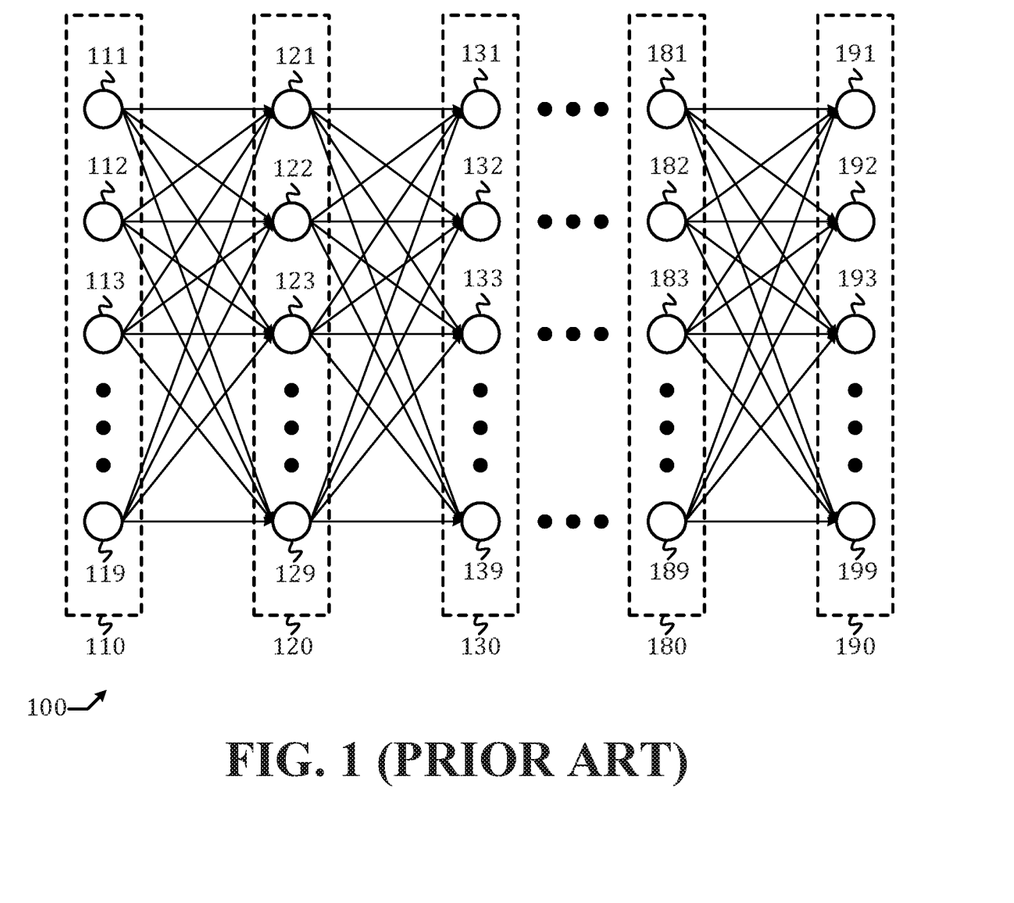
FIG. 1 shows a functional block diagram of an artificial neural network.

As shown in FIG. 1, an artificial neural network (ANN) 100 comprises a plurality of layers including an input layer 110, a plurality of hidden layers 120, 130, . . . , 180, and an output layer 190. Each layer comprises a plurality of neurons. For instance, hidden layer 120 comprises neurons 121, 122, 123, . . . , 129. Except for neurons in the input layer 110, each neuron receives inputs from neurons in a preceding layer. For instance, neuron 121 receives inputs from neurons 111, 112, 113, . . . , 119. Except for neurons in the output layer 190, each neuron provides an output to neurons of a succeeding layer. For instance, neuron 121 provides an output to neurons 131, 132, 133, . . . , 139. Except for neurons in the input layer, a function of a neuron can be described by a monotonic function of a weighted sum of inputs from neurons of the preceding layer.

A neuron can be implemented in a digital scheme, or an analog scheme. Digital neurons can offer high accuracy, but are subject to high power consumption due to the need of using a large quantity of transistors that can lead to a very high static leakage current. Analog neurons, on the other hand, can be highly power efficient but are by nature limited in accuracy due to various impairments in a manufacturing process. For instance, in the absence of impairments, the output of a neuron should be zero when all the inputs are zero. Due to device mismatch in the manufacturing process, however, in practice the output may not be zero. This leads to an impairment known as "offset." Analog neurons can be a viable choice for applications that do not demand high accuracy, provided the impairments pertaining to the analog nature can be mitigated.

What is desired is a mixed-signal neuron architecture that can mitigate an impairment pertaining to the analog nature.

SUMMARY

In an embodiment, artificial neural network comprises: a set of gain cells configured to receive a set of input voltages and output a set of local currents in accordance with a set of control signals, respectively, wherein each respective control signal in said set of control signals comprises a respective set of binary signals; a global summing circuit configured to sum said set of local currents into a global current; and a load configured to convert the global current into an output voltage; wherein: each respective gain cell in said set of gain cells comprises a respective set of voltage-to-current converters configured to convert a respective input voltage associated with said respective gain cell into a respective set of interim currents, a respective set of multipliers configured to multiply said respective set of interim currents with the respective set of binary signals pertaining to the respective control signal associated with the respective input voltage to output a respective set of conditionally inverted currents, and a respective local summing circuit configured to sum said respective set of conditionally inverted currents into a respective local current in said set of local currents.

In an embodiment, a method for an artificial neural network comprises: receiving a set of input voltages; converting a respective input voltage in said set of input voltages into a respective set of local currents using a voltage-to-current conversion; multiplying said respective set of local currents by a respective set of binary signals to establish a respective set of conditionally inverted currents; summing said respective set of conditionally inverted currents into a respective local current; summing all respective local currents into a global current; and converting the global current into an output voltage using a load circuit.

DETAILED DESCRIPTION OF THIS INVENTION

The present invention relates to neuromorphic computing for deep learning based inference applications. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art understand terms and basic concepts related to microelectronics that are used in this disclosure, such as "signal," "voltage," "current," "CMOS (complementary metal oxide semiconductor)," "PMOS (P-channel metal oxide semiconductor) transistor," "NMOS (N-channel metal oxide semiconductor) transistor," "current source," and "bias." Terms and basic concepts like these are apparent to those of ordinary skill in the art and thus will not be explained in detail here. Those of ordinary skill in the art can also recognize symbols of PMOS transistor and NMOS transistor, and identify the "source," the "gate," and the "drain" terminals thereof.

A logical signal is a signal of two states: a first logical state (or a "high" state), and a second logical state (or a "low" state). When a logical signal is said to be high (low), it means it is in the "high" ("low") state, and it occurs when the logical signal is sufficiently above (below) a threshold level that is called a "trip point." Every logical signal has a trip point, and two logical signals may not necessarily have the same trip point.

The present disclosure is presented from an engineering perspective (as opposed to a theoretical perspective). For instance, "X is equal to Y" means: "a difference between X and Y is smaller than a specified engineering tolerance." "X is substantially smaller than Y" means: "a ratio between X and Y is smaller than a specified engineering tolerance." "X is substantially zero" means "an absolute value of X is less than a specified engineering tolerance."

Figure 2:
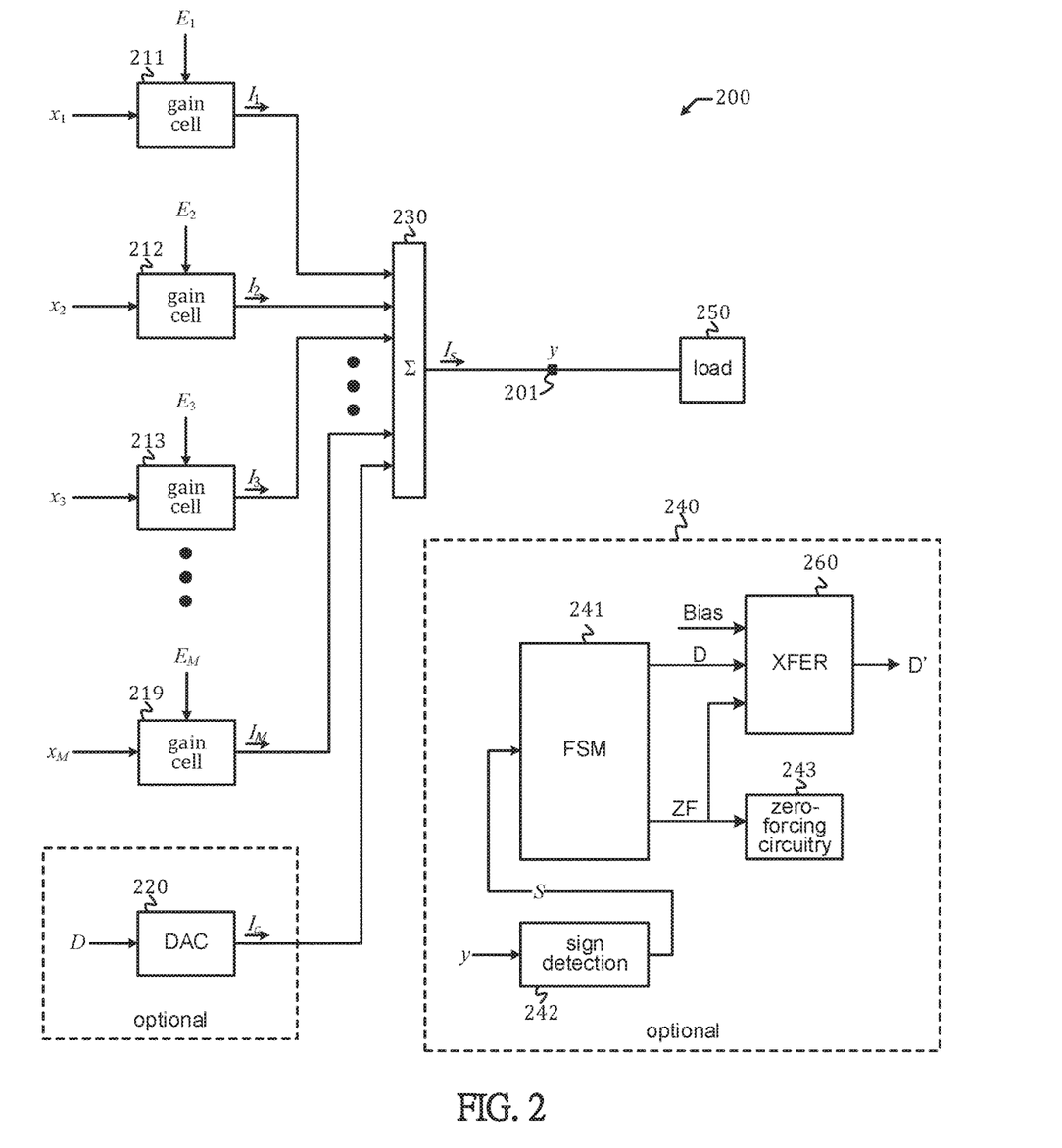
FIG. 2 shows a functional block diagram of a neuron for an artificial neural network in accordance with an embodiment of the present disclosure.

A functional block diagram of an artificial neuron 200 in accordance with an embodiment of the present invention is shown in FIG. 2. Neuron 200 receives a set of inputs $x_1, x_2, x_3, \ldots, x_M$ and outputs an output y in accordance with a set of control words $E_1, E_2, E_3, \ldots, E_M$. Neuron 200 comprises: a set of gain cell circuits 211, 212, 213, . . . , 219 configured to receive $x_1, x_2, x_3, \ldots, x_M$ and output a set of local currents $I_1, I_2, I_3, \ldots, I_M$ in accordance with control words $E_1, E_2, E_3, \ldots, E_M$, respectively; a summing circuit 230 configured to output a global current $I_s$ to an output node 201 in accordance with a sum of said set of local currents $I_1, I_2, I_3, \ldots, I_M$; and a load 250 configured to establish the output y at the output node 201 in response to the global current $I_s$ in accordance with a transfer characteristics that embodies a monotonic function. Mathematically, $I_i$ is equal to $x_i$ multiplied by a weight determined by $E_i$, i.e.

$$I_i = W_i(E_i) x_i, \tag{1}$$

for i=1, 2, 3, . . . , M. Here, $W_i(E_i)$ denotes the weight determined by $E_i$.

The global current $I_s$ can be mathematically modeled by:

$$I_s = \sum_{i=1}^{M} I_i. \tag{2}$$

The output y can be modeled by $$y = f(I_s), \tag{3}$$

where f (•) denotes the monotonic function provided by the load 250.

In a mixed-signal embodiment in accordance with the present disclosure, $E_i$ is represented by a set of N binary signals denoted by $E_{i,1}, E_{i,2}, E_{i,3}, \ldots, E_{i,N}$, such that $W_i(E_i)$ term can be represented by the following equation:

$$W_i(E_i) = \sum_{j=1}^{N} E_{i,j} G_j \tag{4}$$

Here, $G_j$ (for j=1, 2, 3, . . . , N) denotes a voltage-to-current conversion gain. Substituting equation (4) into equation (1), we obtain $$I_i = \sum_{j=1}^{N} E_{i,j} G_j x_i, \tag{5}$$

which can be rewritten as $$I_i = \sum_{j=1}^{N} I_{i,j}, \tag{6}$$

where $$I_{i,j} = E_{i,j} G_j x_i. \tag{7}$$

Let $$C_{i,j} = G_j x_i, \tag{8}$$

then equation (7) can be rewritten as $$I_{i,j} = E_{i,j} C_{i,j} \tag{9}$$

Figure 3:
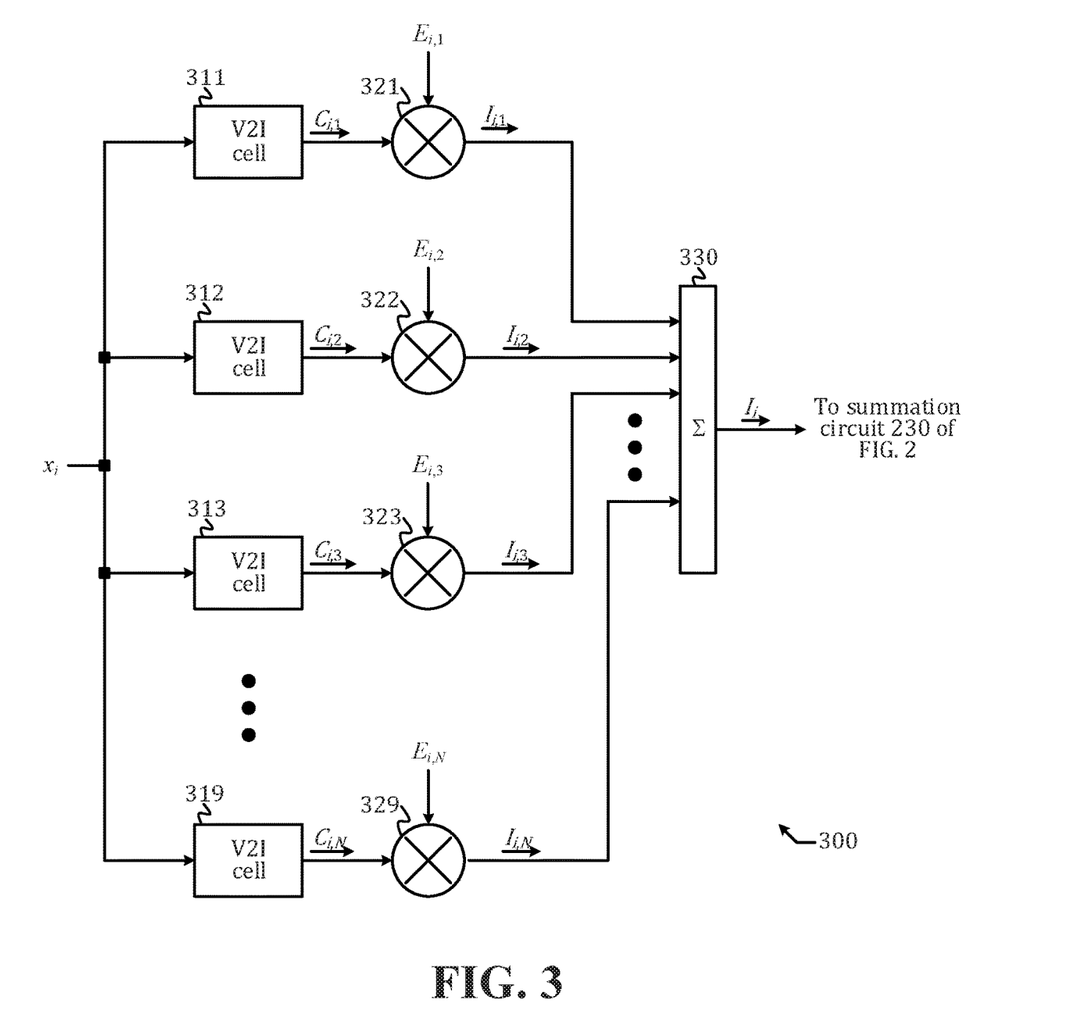
FIG. 3 shows a functional block diagram of a gain cell for the neuron in FIG. 2.

A schematic diagram of a gain cell 300 that can be instantiated to embody gain cells 211, 212, 213, . . . , 219 is shown in FIG. 3. Gain cell 300 receives $x_i$ and $I_i$ outputs in accordance with $E_i$, which comprises $E_{i,1}, E_{i,2}, E_{i,3}, \ldots, E_{i,N}$. Gain cell 300 comprises: a plurality of V2I (voltage-to-current conversion) cells 311, 312, 313, . . . , 319 having voltage-to-current conversion gains $G_1, G_2, G_3, \ldots, G_N$, respectively, and configured to convert $x_i$ into currents $C_{i,1}, C_{i,2}, C_{i,3}, \ldots, C_{i,M}$, respectively, thus embodying equation (8); a plurality of multipliers 321, 322, 323, . . . , 329 configured to multiply $C_{i,1}, C_{i,2}, C_{i,3}, \ldots, C_{i,M}$ with $E_{i,1}, E_{i,2}, E_{i,3}, \ldots, E_{i,N}$, respectively, to output $I_{i,1}, I_{i,2}, I_{i,3}, \ldots, I_{i,N}$, respectively, thus fulfilling equation (9); and a summing circuit 330 configured to sum $I_{i,1}, I_{i,2}, I_{i,3}, \ldots, I_{i,N}$ into $I_i$ thus fulfilling equation (6).

In an embodiment, a differential signaling is used, wherein: $x_1$ comprises two voltages, $x_{1+}$ and $x_{1-}$, and a value of $x_1$ is represented by a difference between $x_{1+}$ and $x_{1-}$; likewise, $I_i$ comprises two currents, $I_+$ and $I_-$, and a value of $I_i$ is represented by a difference between $I_+$ and $I_-$; and so on.

Figure 4:
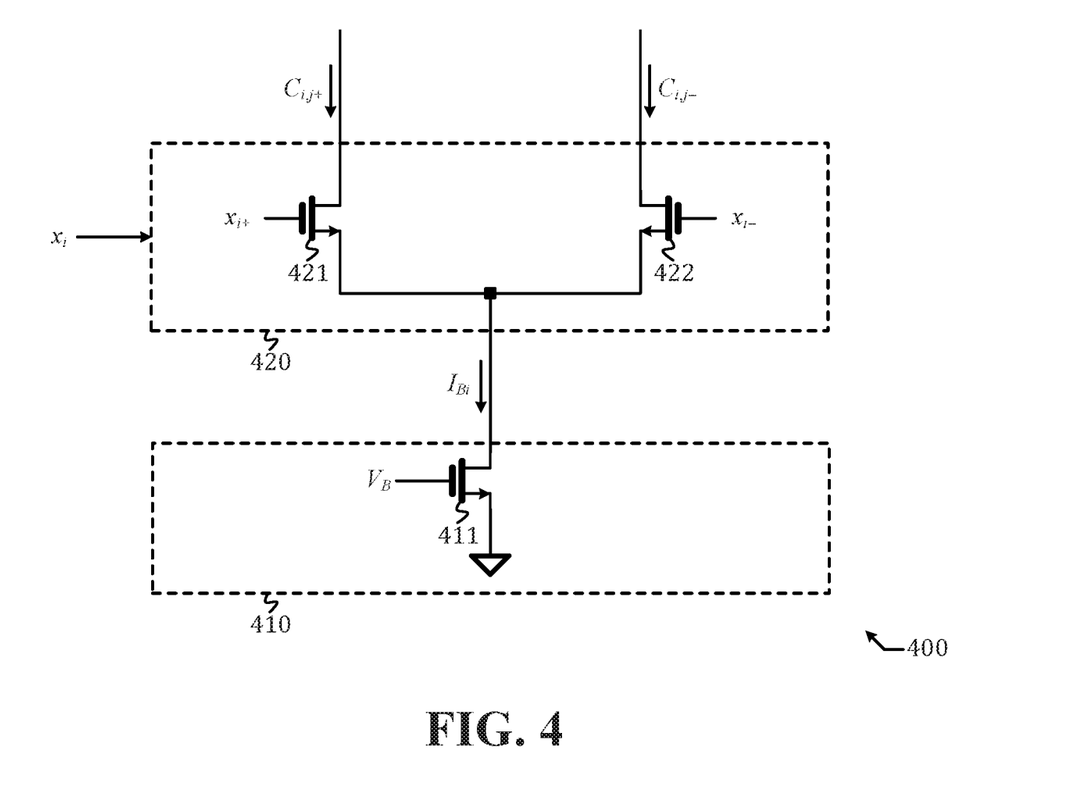
FIG. 4 shows a schematic diagram of a voltage-to-current converter suitable for use in the gain cell of FIG. 3.

A schematic diagram of a V2I 400 that can be instantiated to embody V2I 311, 312, 313, . . . , 319 of FIG. 3 is shown in FIG. 4. V2I 400 comprises: a current source 410 configured to output a bias current $I_{Bi}$; and a differential pair 420 configured to convert $x_1$ into current $C_{i,j}$ in accordance with the bias current $I_{Bi}$. Current source 410 comprises a NMOS transistor 411 biased by a bias voltage $V_B$. Differential pair 420 configured two NMOS transistors 421 and 422 configured to receive $x_{1+}$ and $x_{1-}$ and output $C_{i,j+}$ and $C_{i,j-}$, respectively. Here, $C_{i,j+}$ and $C_{i,j-}$ jointly embody current $C_{i,j}$, as explained earlier regarding differential signaling embodiment.

Figure 5:
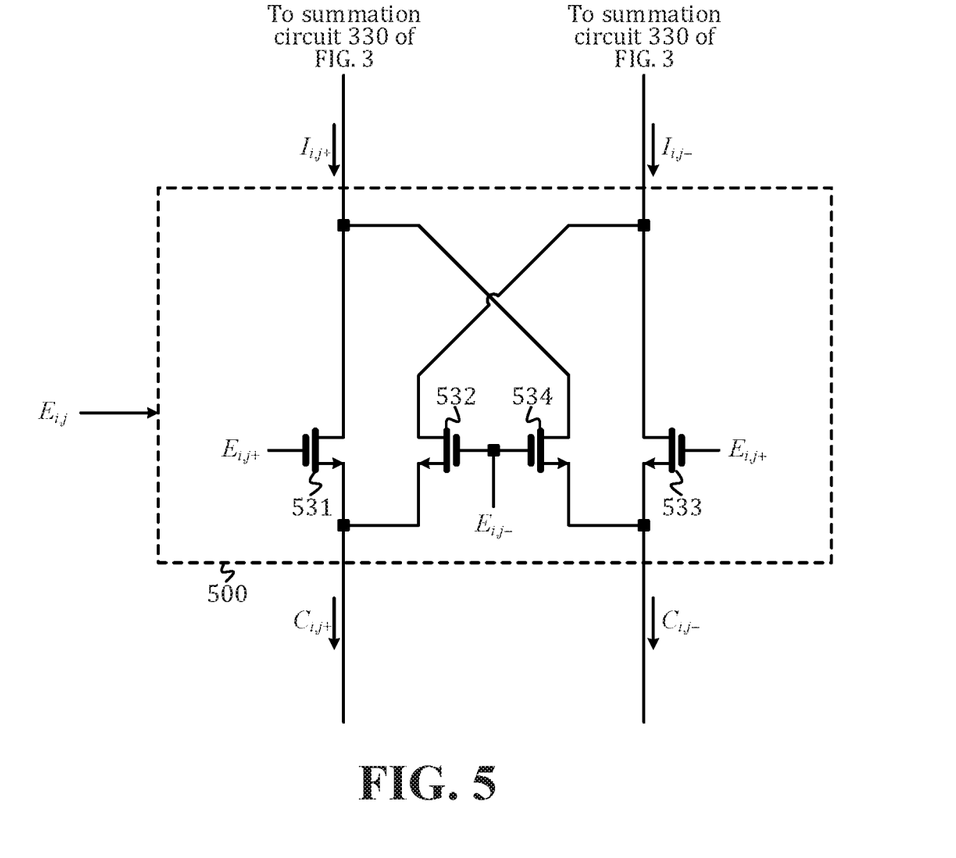
FIG. 5 shows a schematic diagram of a multiplier suitable for use in the gain cell of FIG. 3.

A schematic diagram of a multiplier 500 that can be instantiated to embody multipliers 321, 322, 323, . . . , 329 of FIG. 3 is shown in FIG. 5. Multiplier 500 comprises four NMOS transistors 531, 532, 533, and 534. The binary signal $E_{i,j}$ is embodied by two logical signals $E_{i,j+}$ and $E_{i,j-}$ and encoded according to the following table:

| $E_{i,j}$ | 1 | −1 |
|---|---|---|
| $E_{i,j+}$ | high | low |
| $E_{i,j-}$ | low | high |

NMOS transistors 531 and 532 form a first demultiplexer that directs $C_{i,j+}$ into either $I_{i,j+}$ (when $E_{i,j}$ is 1) or $I_{i,j-}$ (when $E_{i,j}$ is −1); while NMOS transistors 533 and 534 form a second demultiplexer that directs $C_{i,j-}$ into either $I_{i,j-}$ (when $E_{i,j}$ is 1) or $I_{i,j+}$ (when $E_{i,j}$ is −1). As a result, $I_{i,j}$ is either equal to $C_{i,j}$ (when $E_{i,j}$ is 1) or $-C_{i,j}$ (when $E_{i,j}$ is −1), thus fulfilling equation (9). In other words, $I_{i,j}$ is conditionally inverted from $C_{i,j}$.

Now refer to FIG. 3. Since $I_{i,1}, I_{i,2}, I_{i,3}, I_{i,N}$ are all currents, they can be directly tied together to form $I_i$ and implicitly fulfill the function of the summing circuit 330, without the need for incorporating an explicit circuit.

Now refer to FIG. 2. Since $I_1, I_2, I_3, \ldots, I_M$ are all currents, they can be directly tied together to form $I_s$ and implicitly fulfill the function of the summing circuit 230, without the need for incorporating an explicit circuit.

Figure 6:
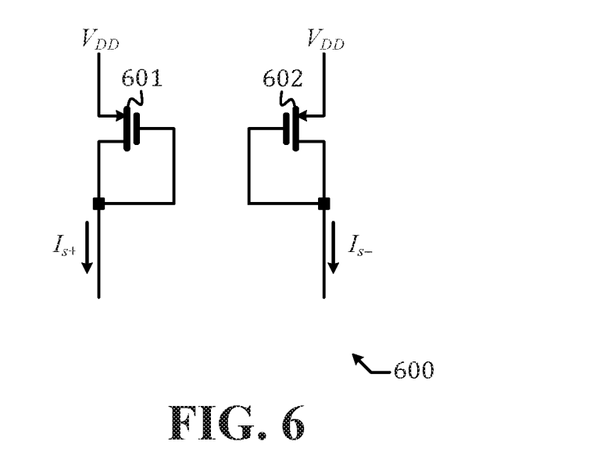
FIG. 6 shows a schematic diagram of a load suitable for use in the neuron of FIG. 2.

An embodiment of a load 600 that can be used to embody load 250 of FIG. 2 is shown in FIG. 6. Load 600 comprises two PMOS transistors 601 and 602, each being configured in a diode-connect topology, configured to receive $I_{s+}$ and $I_{s-}$, respectively. Here, "$V_{DD}$" denotes a power supply node.

The present disclosure offers some advantages. First, a weight $W_i(E_i)$ of a gain cell, as embodied by gain cell 300 of FIG. 3, can be either positive or negative, as a result of using multipliers 321, 322, . . . , 329 that can conditionally embody a polarity inversion function; this makes neuromorphic computing more versatile. Second, a common mode value of the current $I_i$ (that is, a mean value of $I_{i+}$ and $I_{i-}$ in the differential signaling embodiment) is constant regardless of $E_i$, as a result of using multipliers 321, 322, . . . , 329, which can change signs of $I_{i,1}, I_{i,2}, I_{i,3}, \ldots, I_{i,N}$, respectively, but never change the common mode values of $I_{i,1}$, $I_{i,2}, I_{i,3}, \ldots, I_{i,N}$, thus never change the common mode value of It. A constant common mode value makes the system more robust and consistent. Third, the present disclosure is amenable to correcting an offset, which will be explained as follows.

In an embodiment, neuron 200 of FIG. 2 further includes a DAC (digital-to-analog converter) 220 configured to output a calibration current $I_C$ to the summing circuit 230 in accordance with a digital word D. $I_C$ is added as a part of $I_s$ to correct an offset of the neuron 200. When all the inputs $x_1$, $x_2, x_3, \ldots, x_M$ are zero, the output y should also be zero, but in practice the output y may not be zero due to device mismatches in gain cells 211, 212, 213, . . . , 219 and/or load 250. DAC 220 can be used to ensure that the output y is zero, or substantially zero, when all the inputs $x_1, x_2, x_3, \ldots, x_M$ are zero. In an embodiment, neuron 200 further includes a calibration circuit 240, which includes a finite state machine (FSM) 241, a zero-forcing circuitry 243, and a sign-detection circuit 242. In another embodiment, the calibration circuit 240 further includes a bias circuit XFER 260. The bias circuit XFER 260 is configured to receive a zero-forcing command ZF, a digital word D and a bias value and output a biased digital word D'. During a calibration process, FSM 241 issues the zero-forcing command ZF to the XFER 260 and the zero-forcing circuitry 243. When the ZF is asserted, the bias circuit XFER 260 will force the output value of D' equal to the input value of D directly. The zero-forcing circuitry 243 will also force all the inputs $x_1, x_2$, $x_3, \ldots, x_M$ to be frozen at zero. The sign of the output y is detected by the sign-detection circuit 242 and represented by a logical signal S. If y is positive, indicating a positive offset, S will be 1, and FSM 241 will decrease a value of D to make $I_c$ smaller and consequently make y smaller; if y is negative, S will be 0, indicating a negative offset, FSM 241 will increase a value of D to make $I_c$ larger and consequently make y larger. FSM 241 continues this process, and D will eventually converge to an optimum value that minimizes the offset of the output y. FSM 241 concludes the calibration once the convergence is detected (for instance, the value of D does not change by more than two levels within a specified time-out period). The input bias value of XFER 260 is derived from a mathematical model of the neural network graph to avoid saturation of neuron circuitry by shifting the dynamic range of the neuron. Please noted that when the input bias value of XFER 260 is set to zero, the output value of D' of XFER 260 will be equal to the digital word D as well. In another embodiment, the DAC 220 is configured to output the calibration current $I_C$ in accordance with the biased digital word D'.

After the calibration is concluded, FSM 241 withdraw the zero-forcing command ZF, and the zero-forcing circuitry 243 stops its zero-forcing action on $x_1, x_2, x_3, \ldots, x_M$. Moreover, any value of bias and D can be input to the XFER 260 to produce the output value of D'. The transfer function used in XFER 260 can be any function of ZF, bias and D. A signal $x_1$, which comprises $x_{1+}$ and $x_{1-}$ in a differential signaling embodiment, can be forced to zero by turning on a switch that connects $x_{1+}$ to $x_{1-}$ and force them to be equal. The sign of y, which comprises $y_+$ and $y_-$ in a differential signaling embodiment, can be detected by a comparator that compares $y_+$ with $y_-$. Digital-to-analog converters are well known in the prior art and thus not described in detail here.

In an embodiment, values of $E_{i,j}$ (for i=1, 2, 3, . . . , M and j=1, 2, 3, . . . , N) are stored and in a memory device and can be retrieved when needed.

Figure 7:
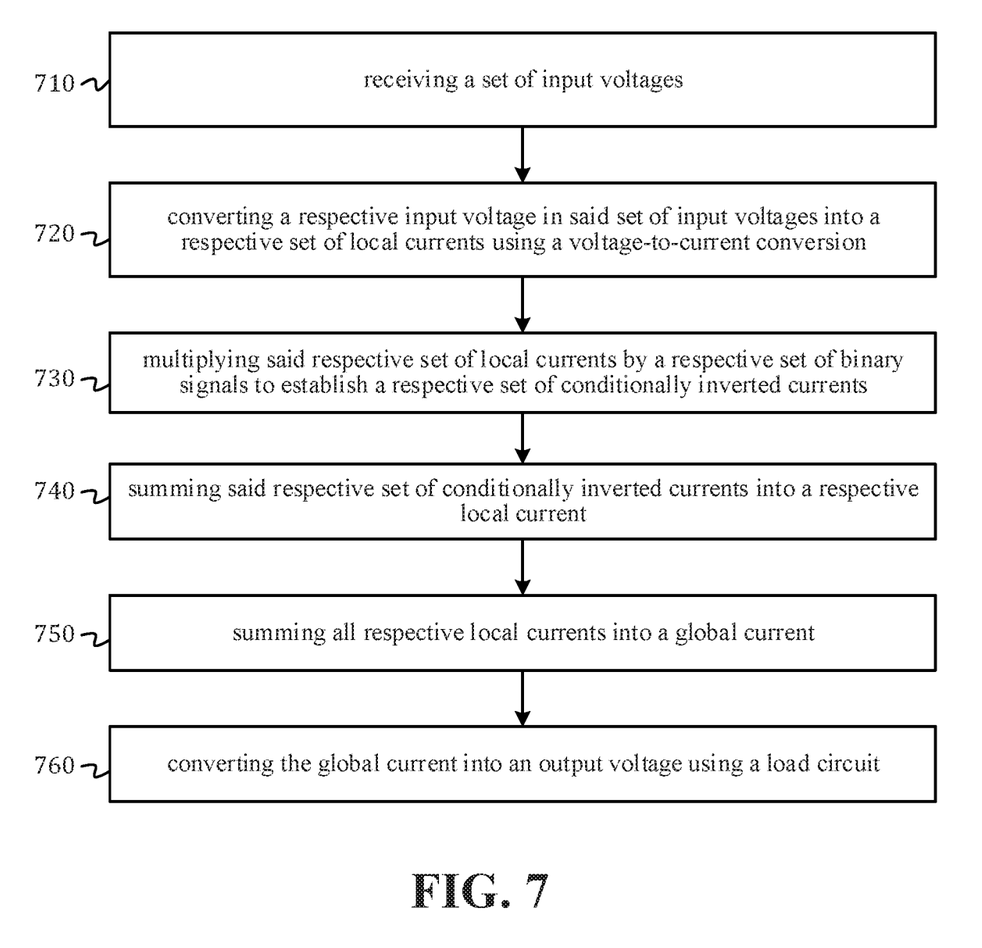
FIG. 7 shows a flow diagram of a method in accordance with an embodiment of the present disclosure.

As illustrated by a flow diagram shown in FIG. 7, a method implementing an artificial neuron in accordance with an embodiment of the present disclosure includes the following steps: (step 710) receiving a set of input voltages; (step 720) converting a respective input voltage in said set of input voltages into a respective set of local currents using a voltage-to-current conversion; (step 730) multiplying said respective set of local currents by a respective set of binary signals to establish a respective set of conditionally inverted currents; (step 740) summing said respective set of conditionally inverted currents into a respective local current; (step 750) summing all respective local currents into a global current; and (step 760) converting the global current into an output voltage using a load circuit.

Those skilled in the art will readily observe that numerous modifications and alterations of the device and method may be made while retaining the teachings of the invention. Accordingly, the above disclosure should not be construed as limited only by the metes and bounds of the appended claims.

What is claimed is:

1. An artificial neural network comprising:
   a set of gain cell circuits configured to receive a set of input voltages and output a set of local currents in accordance with a set of control signals, respectively, wherein each respective control signal in said set of control signals comprises a respective set of binary signals;
   a global summing circuit configured to sum said set of local currents into a global current;
   a load configured to convert the global current into an output voltage, and
   a calibration circuit configured to compute a calibration current having a magnitude equal to the global current, when all input voltages of the set of input voltages are zero;
   wherein:
   each respective gain cell circuit in said set of gain cell circuits comprises a respective set of voltage-to-current converters configured to convert a respective input voltage associated with said respective gain cell circuit into a respective set of interim currents,
   a respective set of multipliers configured to multiply said respective set of interim currents with the respective set of binary signals pertaining to the respective control signal associated with the respective input voltage to output a respective set of conditionally inverted currents, wherein polarity inversions of the respective set of conditionally inverted currents are controlled by the respective set of binary signals,
   a respective local summing circuit configured to sum said respective set of conditionally inverted currents into a respective local current in said set of local currents,
   the global summing circuit is further configured to sum the calibration current with the set of local currents, and wherein the calibration circuit comprises: a sign-detection circuit configured to receive the output voltage and output a logical signal indicating a sign of the output voltage; a finite state machine configured to receive the logical signal and output a digital word and a zero-forcing command; and a zero-forcing circuitry configured to force every input voltage in said set of input voltages to be zero in accordance with the zero-forcing command.

2. The network of claim 1 further includes a digital-to-analog converter configured to receive the digital word and output the calibration current.

3. The network of claim 2, wherein the calibration current is summed into the global current by the global summing circuit.

4. The network of claim 3, wherein the calibration circuit configured to output the digital word.

5. The network of claim 1, wherein in a calibration mode the finite state machine asserts the zero-forcing command and adjusts a value of the digital word in accordance with the logical signal until the value of the digital word converges.

6. The network of claim 5, wherein the calibration circuit further comprises a bias circuit configured to receive the zero-forcing command, the digital word and a bias value and output a biased digital word, and when the zero-forcing command is asserted, the biased digital word equals to the digital word; when the zero-forcing command is not asserted, the biased digital word is a transfer function of the digital word and the bias value.

7. A method implementing an artificial neuron comprising the following steps:
receiving a set of input voltages;
converting a respective input voltage in said set of input voltages into a respective set of local currents using a voltage-to-current conversion;
multiplying said respective set of local currents by a respective set of binary signals to establish a respective set of conditionally inverted currents, wherein polarity inversions of the respective set of conditionally inverted currents are controlled by the respective set of binary signals;
summing said respective set of conditionally inverted currents into a respective local current;
computing a calibration current having a magnitude equal to a global current, when all input voltages of the set of input voltages are zero;
summing all respective local currents into the global current, and summing the calibration current with the set of local currents; and
converting the global current into an output voltage using a load circuit,
wherein the computing the calibration current comprises: utilizing a sign-detection circuit to receive the output voltage and output a logical signal indicating a sign of the output voltage; using a finite state machine to receive the logical signal and output a digital word and a zero-forcing command; and using zero-forcing circuitry to force every input voltage in said set of input voltages to be zero in accordance with the zero-forcing command.

8. The method of claim 7 further comprises: correcting an offset of the output voltage by injecting the calibration current into the load circuit.

9. The method of claim 8 further comprises: adjusting the calibration current in a closed-loop manner based on the sign of the output voltage during a calibration period.

10. The method of claim 9, wherein all input voltages are set to zero during the calibration period.

* * * * *